United States Patent
Kashiwagi et al.

(10) Patent No.: US 10,642,168 B2
(45) Date of Patent: May 5, 2020

(54) AUXILIARY EXPOSURE APPARATUS AND EXPOSURE AMOUNT DISTRIBUTION ACQUISITION METHOD

(71) Applicant: Tokyo Electron Limited, Tokyo (JP)

(72) Inventors: Hideaki Kashiwagi, Koshi (JP); Takafumi Niwa, Koshi (JP); Norihisa Koga, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/720,891

(22) Filed: Sep. 29, 2017

(65) Prior Publication Data

US 2018/0095370 A1   Apr. 5, 2018

(30) Foreign Application Priority Data

Oct. 4, 2016 (JP) .................. 2016-196342

(51) Int. Cl.
| | |
|---|---|
| *G03F 7/20* | (2006.01) |
| *H01L 21/67* | (2006.01) |
| *G03F 7/16* | (2006.01) |
| *G03F 7/40* | (2006.01) |
| *H01L 21/027* | (2006.01) |
| *H01L 21/66* | (2006.01) |

(52) U.S. Cl.
CPC .......... *G03F 7/70991* (2013.01); *G03F 7/168* (2013.01); *G03F 7/2022* (2013.01); *G03F 7/40* (2013.01); *H01L 21/027* (2013.01); *H01L 21/67178* (2013.01); *H01L 21/67225* (2013.01); *H01L 21/67253* (2013.01); *H01L 21/67248* (2013.01); *H01L 22/20* (2013.01)

(58) Field of Classification Search
CPC .......... G03F 7/168; G03F 7/2022; G03F 7/40; G03F 7/70991; G03F 7/70; H01L 21/027; H01L 21/67248; H01L 21/67253; H01L 22/20; A61B 1/00009; A61B 1/00016; A61B 1/00025; A61B 1/00112; A61B 1/041; A61B 5/073; G02B 23/2484
See application file for complete search history.

(56) References Cited

U.S. PATENT DOCUMENTS

| | | | | |
|---|---|---|---|---|
| 5,751,428 A | * | 5/1998 | Kataoka | G03F 7/70425 250/548 |
| 5,774,575 A | * | 6/1998 | Tanaka | G01N 21/94 348/130 |
| 9,081,149 B2 | * | 7/2015 | Wu | G02B 7/32 |

(Continued)

FOREIGN PATENT DOCUMENTS

| | | |
|---|---|---|
| JP | H05-315217 A | 11/1993 |
| JP | H09-045604 A | 2/1997 |

(Continued)

*Primary Examiner* — Deoram Persaud
(74) *Attorney, Agent, or Firm* — Posz Law Group, PLC (57) ABSTRACT

An auxiliary exposure apparatus is for performing auxiliary exposure of applying light of a predetermined wavelength from a laser light source to a resist film on a wafer, separately from exposure processing of transferring a pattern of a mask to the resist film applied on the wafer. The auxiliary exposure apparatus includes a first total reflection mirror that reflects the light from the laser light source toward the wafer; and an imaging device including a light receiving part that receives light after reflected by the wafer.

13 Claims, 8 Drawing Sheets

(56) References Cited

U.S. PATENT DOCUMENTS

| | | | |
|---|---|---|---|
| 9,146,481 B2* | 9/2015 | Ota | G03F 7/70291 |
| 9,791,783 B2* | 10/2017 | Hur | G03F 7/70191 |
| 9,869,935 B2* | 1/2018 | Schmitt | G02B 5/3025 |
| 2006/0001852 A1* | 1/2006 | Lee | G03B 27/42 |
| | | | 355/53 |
| 2006/0066829 A1* | 3/2006 | Sekine | G03F 7/70283 |
| | | | 355/67 |
| 2008/0204685 A1* | 8/2008 | Kono | G03F 7/70291 |
| | | | 355/53 |
| 2013/0201460 A1* | 8/2013 | Tani | G03F 7/70341 |
| | | | 355/30 |
| 2014/0347643 A1* | 11/2014 | Kotoku | G03F 7/70558 |
| | | | 355/52 |
| 2015/0044600 A1* | 2/2015 | Hung | G03F 1/38 |
| | | | 430/5 |
| 2015/0146178 A1 | 5/2015 | deVilliers et al. | |
| 2015/0147164 A1 | 5/2015 | Cui et al. | |
| 2015/0253674 A1* | 9/2015 | Nagai | G03F 7/7005 |
| | | | 438/795 |

FOREIGN PATENT DOCUMENTS

| | | |
|---|---|---|
| JP | H10-142538 A | 5/1998 |
| JP | 2001-345245 A | 12/2001 |
| JP | 2006-330441 A | 12/2006 |
| JP | 2009-170663 A | 7/2009 |
| JP | 2013-186191 A | 9/2013 |
| JP | 2015-210517 A | 11/2015 |

\* cited by examiner

FIG.12

AUXILIARY EXPOSURE APPARATUS AND EXPOSURE AMOUNT DISTRIBUTION ACQUISITION METHOD

CROSS REFERENCE TO RELATED APPLICATIONS

This application is based upon and claims the benefit of priority of the prior Japanese Patent Application No. 2016-196342, filed in Japan on Oct. 4, 2016, the entire contents of which are incorporated herein by reference.

BACKGROUND OF THE INVENTION

1. Field of the Invention

The present invention relates to an auxiliary exposure apparatus that performs auxiliary exposure of applying an ultraviolet ray separately from normal exposure processing of transferring a pattern of a mask to a resist film applied on a substrate, and an exposure amount distribution acquisition method of acquiring an exposure amount distribution in auxiliary exposure.

2. Description of the Related Art

In a photolithography process in a manufacturing process of a semiconductor device or the like, a resist coating treatment of applying a resist solution onto a substrate such as a semiconductor wafer (hereinafter, referred to as a wafer) to form a resist film, exposure processing of exposing a predetermined pattern on the resist film, a developing treatment of developing the exposed resist film and so on are performed in sequence. This forms a predetermined resist pattern on the wafer. The series of treatments and processing is performed by a substrate processing system equipped with various treatment apparatuses each treating the wafer, carrier mechanisms each carrying the wafer and so on and an exposure apparatus.

In the exposure apparatus, for example, a long and narrow beam formed by a light source and a slit of N mm×25 mm (N is, for example, 1 to 3) is scanned to expose a region of 35 mm×25 mm on the wafer.

Incidentally, with advancement of microfabrication of the pattern by the photolithography, making the line width of the resist pattern obtained on the wafer after the developing treatment uniform becomes more difficult, and the in-plane uniformity of the line width of the resist pattern is a major problem.

Hence, in order to improve the in-plane uniformity of the line width of the resist pattern, exposure to uniform light is performed conventionally only for a decided time period for each exposure shot in the above-described exposure using the slit. The exposure shot mentioned here refers to a region irradiated by one time exposure via the slit in the case of scanning using the slit where the entire wafer is subjected to exposure by performing exposure a plurality of times via the slit. Note that each exposure shot partially overlaps with adjacent exposure shots.

However, recently, microfabrication is further advanced to make the problem in variation of line width in the exposure shot conspicuous. As a measure against the above, a method of adjusting an exposure amount for each exposure shot is employed.

This method, however, performs exposure using the slit of N mm×25 mm, and therefore can change the exposure amount in a direction in which the slit is scanned, but cannot change the exposure amount in one exposure shot. Further, the width of the slit in the scan direction is also as large as about several millimeters, and the adjustment of the exposure amount in the scan direction is not sufficient, thus leaving room for improvement in terms of in-plane uniformity of the line width of the resist pattern.

Based on such a background, as a method of improving the in-plane uniformity of the line width of the resist pattern, the following one is considered. Specifically, the method performs, separately from normal exposure processing of transferring a pattern of a mask, exposure (auxiliary exposure) of the entire wafer is performed by exposing each divided irradiation area on the wafer upper surface using a beam having a diameter smaller than that of a beam used for the normal exposure processing, so that, for example, the total exposure amount in the normal exposure processing and the auxiliary exposure processing has a predetermined distribution (refer to Japanese Laid-open Patent Publication No. 2013-186191, US Patent Publication No. 2015/146178 and US Patent Publication No. 2015/147164).

However, even if the output of the light source at the time of auxiliary exposure is adjusted as described above, the desired exposure amount cannot be obtained in each divided irradiation area on the wafer upper surface in some cases because the light path from the light source to each divided irradiation area is different.

Regarding this point, the auxiliary exposure apparatus in Japanese Laid-open Patent Publication No. 2013-186191 moves an illuminometer to the same position as that of the upper surface of the wafer for every fixed apparatus operation time or every fixed month and date, measures the illuminance at the auxiliary exposure position by the illuminometer, and acquires the relation between the measured result and a command value of light output. This makes it possible to make the actual exposure amount closer to the desired exposure amount.

However, the measurement of the illuminance at the auxiliary exposure position is performed for every fixed apparatus operation time or every fixed month and date as described in the auxiliary exposure apparatus in Patent Document 1, in other words, the measurement interval is large. Accordingly, the state of the light path from the light source to each irradiation area on the wafer upper surface changes between measurements due to change in apparatus environment or the like, and the desired illuminance to the command value of the light output, namely, exposure amount cannot be obtained any longer, possibly resulting in decreased in-plane uniformity of the line width of the resist pattern.

Note that US Patent Publication No. 2015/146178 and US Patent Publication No. 2015/147164 do not disclose this point.

SUMMARY OF THE INVENTION

The present invention has been made in consideration of the above point, and its object is to more reliably improve an in-plane uniformity of a line width of a resist pattern in the case of performing auxiliary exposure of applying ultraviolet light separately from normal exposure processing of transferring a pattern of a mask to a resist film applied on a substrate.

To achieve the above object, the present invention is an auxiliary exposure apparatus for applying light of a predetermined wavelength from a light source to a resist film on a substrate, separately from exposure processing of transferring a pattern of a mask to the resist film applied on the substrate, the auxiliary exposure apparatus including: a first reflection member configured to reflect the light from the light source toward the substrate; and a light receiving part configured to receive light after reflected by the substrate.

The present invention according to another aspect is an exposure amount distribution acquisition method of acquiring a distribution of an exposure amount to a resist film on a substrate, in auxiliary exposure processing performed separately from exposure processing of transferring a pattern of a mask to the resist film applied on the substrate, the exposure amount distribution acquisition method including: reflecting light from a light source configured to emit light of a predetermined wavelength, toward the substrate by a first reflection member in the auxiliary exposure processing; receiving light after reflected by the substrate by a light receiving part; and acquiring the distribution of the exposure amount to the resist film on the substrate, based on a result of reception of the light by the light receiving part.

According to the present invention, it is possible to further reliably improve the in-plane uniformity of the line width of the resist pattern.

DETAILED DESCRIPTION OF THE INVENTION

First Embodiment

Figure 1:
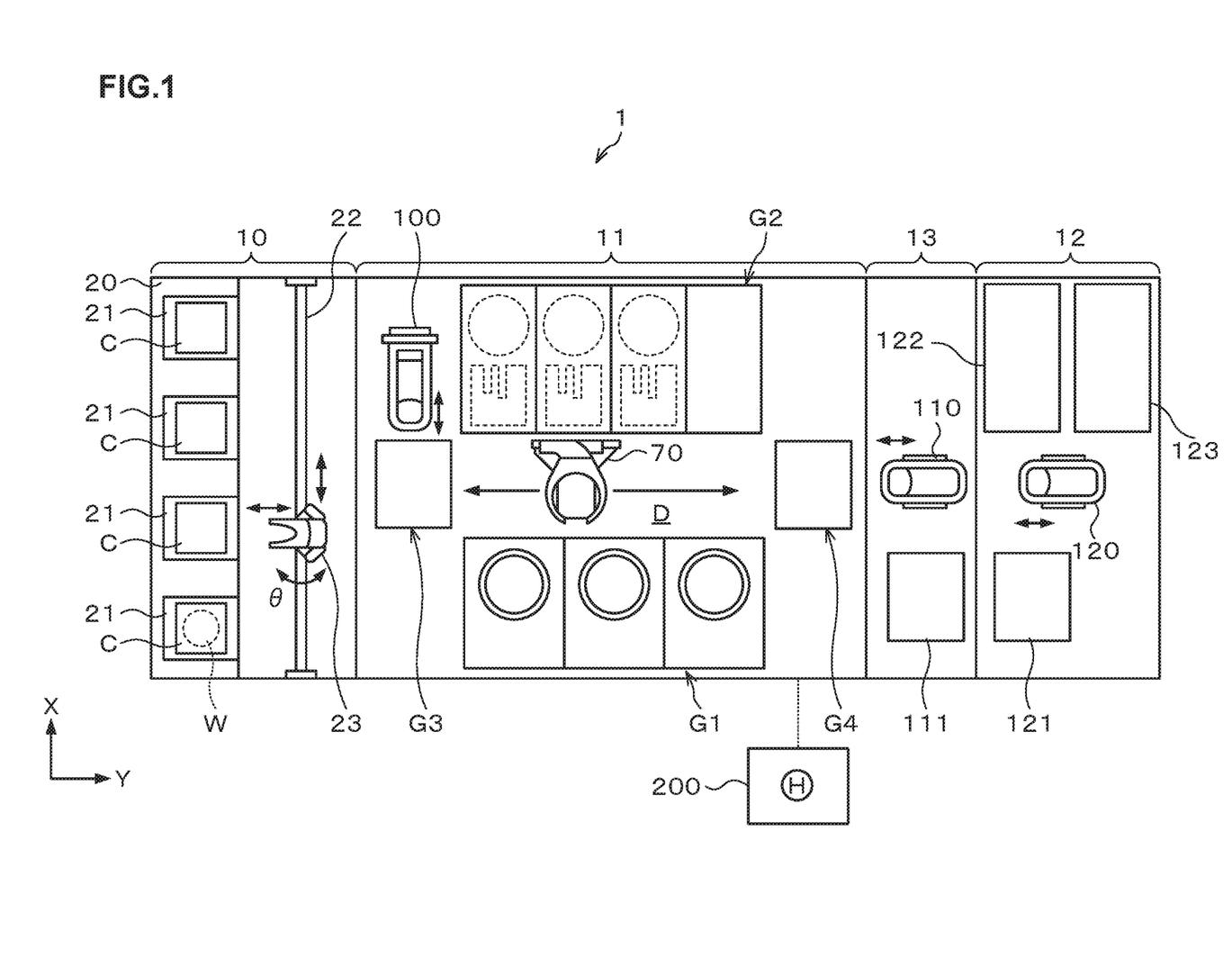
FIG. 1 is a plan view illustrating the outline of a configuration of a substrate processing system according to a first embodiment of the present invention.
Figure 2:
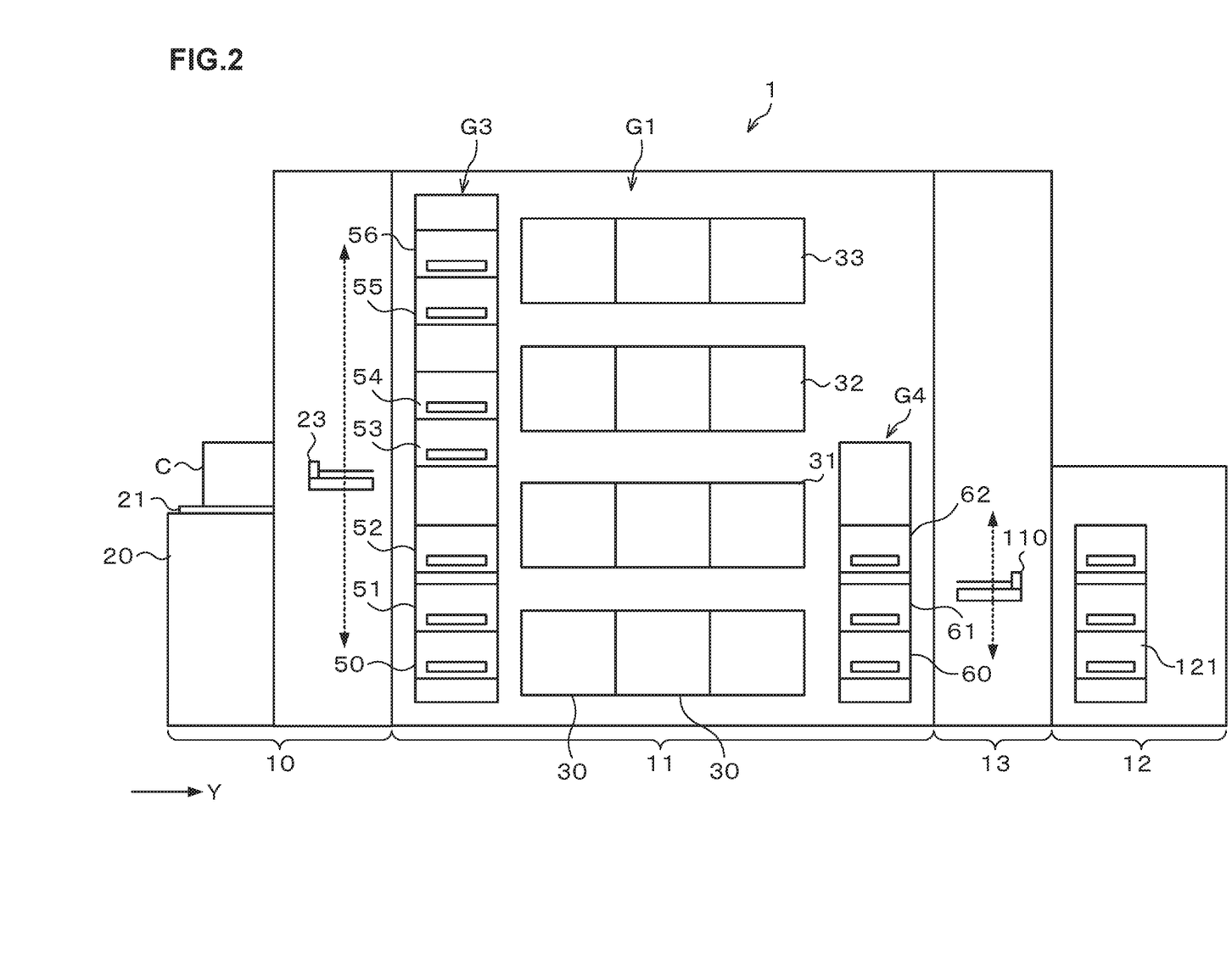
FIG. 2 is a front view illustrating the outline of the configuration of the substrate processing system according to the first embodiment of the present invention.
Figure 3:
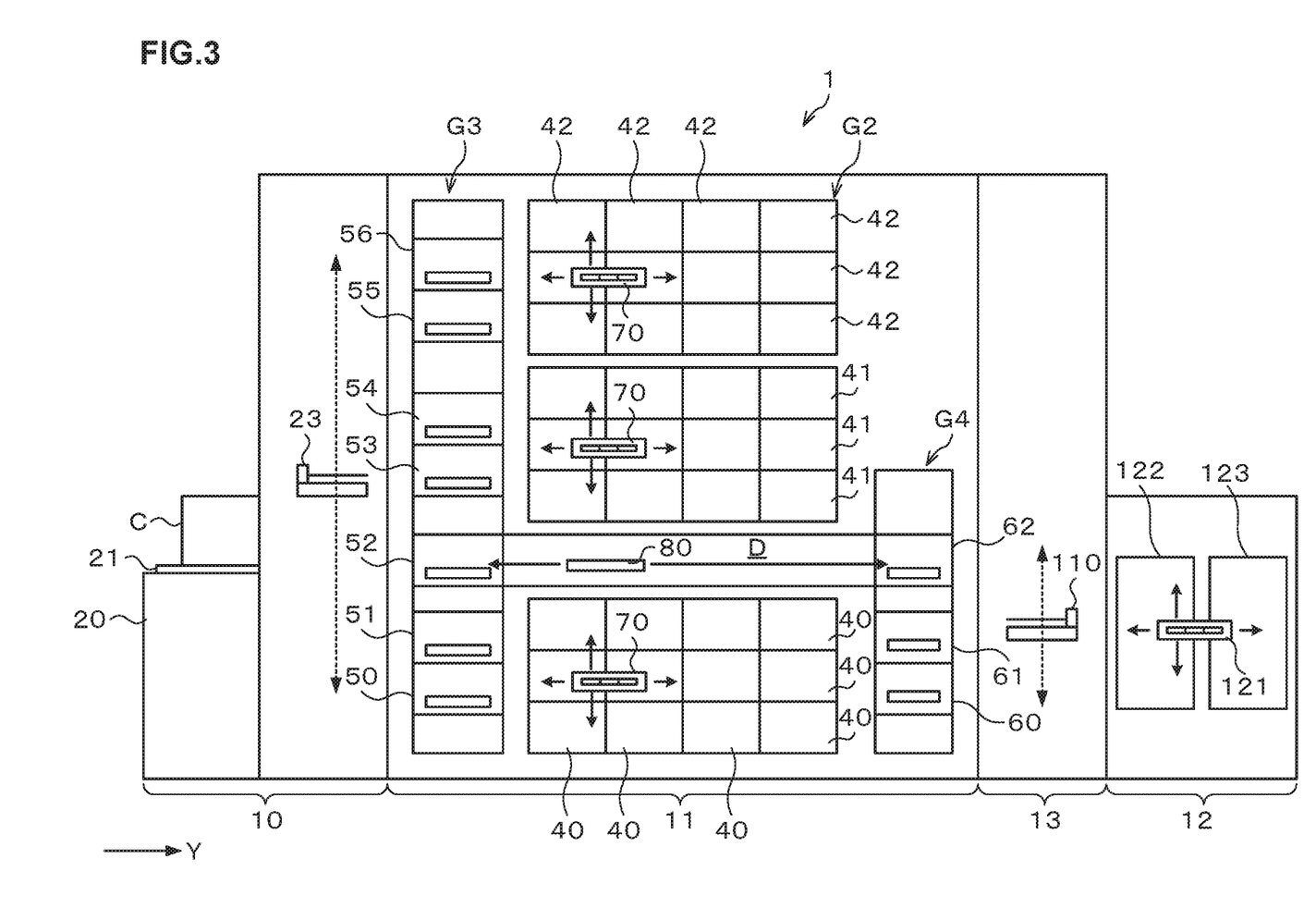
FIG. 3 is a rear view illustrating the outline of the configuration of the substrate processing system according to the first embodiment of the present invention.

Hereinafter, embodiments of the present invention will be described. FIG. 1 is an explanatory view illustrating the outline of a configuration of a substrate processing system 1 equipped with an exposure station including an auxiliary exposure apparatus according to a first embodiment of the present invention. FIG. 2 and FIG. 3 are a front view and a rear view schematically illustrating the outline of an internal configuration of the substrate processing system 1, respectively. Note that in this specification and the drawings, components having substantially the same functional configurations are denoted by the same signs to omit duplicate description.

The substrate processing system 1 has, as illustrated in FIG. 1, a configuration in which a cassette station 10 into/out of which a cassette C housing a plurality of wafers W is carried, a treatment station 11 which includes a plurality of various treatment apparatuses performing predetermined treatments on the wafer W, and an interface station 13 which delivers the wafer W to/from an exposure station 12 adjacent to the treatment station 11, are integrally connected.

In the cassette station 10, a cassette mounting table 20 is provided. The cassette mounting table 20 is provided with a plurality of cassette mounting plates 21 on which the cassettes C are mounted when the cassettes C are carried in/out from/to the outside of the substrate processing system 1.

In the cassette station 10, a wafer carrier apparatus 23 is provided which is movable on a carrier path 22 extending in an X-direction as illustrated in FIG. 1. The wafer carrier apparatus 23 is movable also in a vertical direction and around a vertical axis (in a θ-direction), and can carry the wafer W between the cassette C on each of the cassette mounting plates 21 and a later-described delivery apparatus in a third block G3 in the treatment station 11.

In the treatment station 11, a plurality of, for example, four blocks G1, G2, G3, G4 are provided each including various apparatuses. For example, the first block G1 is provided on the front side (X-direction negative direction side in FIG. 1) in the treatment station 11, and the second block G2 is provided on the rear side (X-direction positive direction side in FIG. 1) in the treatment station 11. Further, the third block G3 is provided on the cassette station 10 side (Y-direction negative direction side in FIG. 1) in the treatment station 11, and the fourth block G4 is provided on the interface station 13 side (Y-direction positive direction side in FIG. 1) in the treatment station 11.

For example, in the first block G1, as illustrated in FIG. 2, a plurality of solution treatment apparatuses, for example, developing treatment apparatuses 30 each of which performs a developing treatment on the wafer W, lower anti-reflection film forming apparatuses 31 each of which forms an anti-reflection film (hereinafter, referred to as a "lower anti-reflection film") at a lower layer of a resist film of the wafer W resist coating apparatuses 32 each of which applies a resist solution to the wafer W to form a resist film, and upper anti-reflection film forming apparatuses 33 each of which forms an anti-reflection film (hereinafter, referred to as an "upper anti-reflection film") at an upper layer of the resist film of the wafer W, are arranged in this order from the bottom.

For example, three each of the developing treatment apparatus 30, the lower anti-reflection film forming apparatus 31, the resist coating apparatus 32, and the upper anti-reflection film forming apparatus 33 are arranged side by side in the horizontal direction. Note that the numbers and the arrangement of the developing treatment apparatuses 30, the lower anti-reflection film forming apparatuses 31, the resist coating apparatuses 32, and the upper anti-reflection film forming apparatuses 33 can be arbitrarily selected.

In each of the solution treatment apparatuses such as the developing treatment apparatus 30, the lower anti-reflection film forming apparatus 31, the resist coating apparatus 32, and the upper anti-reflection film forming apparatus 33, for example, spin coating of applying a predetermined treatment solution onto the wafer W is performed. In the spin coating, the treatment solution is discharged, for example, from a coating nozzle onto the wafer W and the wafer W is rotated to diffuse the treatment solution over the front surface of the wafer W.

For example, in the second block G2, as illustrated in FIG. 3, thermal treatment apparatuses 40 each of which performs thermal treatments such as heating and cooling on the wafer W, adhesion apparatuses 41 each for enhancing adhesion between the resist solution and the wafer W, and edge exposure apparatuses 42 each of which exposes the outer peripheral portion of the wafer W, are provided side by side in the vertical direction and in the horizontal direction. The numbers and the arrangement of the thermal treatment apparatuses 40, the adhesion apparatuses 41, and the edge exposure apparatuses 42 can also be arbitrarily selected.

For example, in the third block G3, a plurality of delivery apparatuses 50, 51, 52, 53, 54, 55, 56 are provided in order from the bottom. Further, in the fourth block G4, a plurality of delivery apparatuses 60, 61, 62 are provided in order from the bottom.

A wafer carry region D is formed in a region surrounded by the first block G1 to the fourth block G4 as illustrated in FIG. 1. In the wafer carry region D, for example, a plurality of wafer carrier apparatuses 70 are arranged each of which has a carrier arm movable, for example, in the Y-direction, the X-direction, the θ-direction, and the vertical direction. The wafer carrier apparatus 70 can move in the wafer carry region D to carry the wafer W to a predetermined apparatus in the first block G1, the second block G2, the third block G3 and the fourth block G4 therearound.

Further, in the wafer carry region D, a shuttle carrier apparatus 80 is provided which linearly carries the wafer W between the third block G3 and the fourth block G4.

The shuttle carrier apparatus 80 is configured to be linearly movable, for example, in the Y-direction in FIG. 3. The shuttle carrier apparatus 80 can move in the Y-direction while supporting the wafer W, and carry the wafer W between the delivery apparatus 52 in the third block G3 and the delivery apparatus 62 in the fourth block G4.

As illustrated in FIG. 1, a wafer carrier apparatus 100 is provided adjacent on the X-direction positive direction side of the third block G3. The wafer carrier apparatus 100 has a carrier arm that is movable, for example, in the X-direction, the θ-direction, and the vertical direction. The wafer carrier apparatus 100 can move up and down while supporting the wafer W to carry the wafer W to each of the delivery apparatuses in the third block G3.

In the interface station 13, a wafer carrier apparatus 110 and a delivery apparatus 111 are provided. The wafer carrier apparatus 110 has a carrier arm that is movable, for example, in the Y-direction, the θ-direction, and the vertical direction. The wafer carrier apparatus 110 can carry the wafer W to/from each of the delivery apparatuses in the fourth block G4, the delivery apparatus 111, and a delivery apparatus 121 in the exposure station 12, for example, while supporting the wafer W by the carrier arm.

In the exposure station 12, a wafer carrier apparatus 120, the delivery apparatus 121, an exposure apparatus 122, and an auxiliary exposure apparatus 123 are provided. The wafer carrier apparatus 120 has a carrier arm that is movable, for example, in the X-direction, the Y-direction, the θ-direction, and the vertical direction. The wafer carrier apparatus 120 can carry the wafer W to/from the delivery apparatus 121, the exposure apparatus 122, and the auxiliary exposure apparatus 123, for example, while supporting the wafer W by the carrier arm.

The exposure apparatus 122 is an exposure apparatus that performs normal exposure (hereinafter, main exposure) of transferring a pattern of a photomask to the resist on the wafer W.

The auxiliary exposure apparatus 123 performs auxiliary exposure of applying ultraviolet light of a predetermined wavelength (for example, 267 nm) to the resist film on the wafer separately from the exposure processing by the exposure apparatus 122. The auxiliary exposure by the auxiliary exposure apparatus 123 can improve the in-plane uniformity of the line width of the resist pattern obtained after the developing treatment.

In the above substrate processing system 1, a control unit 200 is provided as illustrated in FIG. 1. The control unit 200 is, for example, a computer and has a program storage unit (not illustrated). In the program storage unit, a program that executes the treatments and carrying of the wafer W in the substrate processing system 1, the normal exposure of the wafer W, the auxiliary exposure of the wafer W and so on are stored. Note that the program may be the one which are recorded, for example, in a computer-readable storage medium H such as a computer-readable hard disk (HD), flexible disk (FD), compact disk (CD), magneto-optical disk (MO), or memory card and installed from the storage medium H into the control unit 200.

In the treatment method for the wafer W performed using the substrate processing system 1 configured as described above, first, the cassette C housing a plurality of wafers W is carried into the cassette station 10. The wafer W in the cassette C is carried by the wafer carrier apparatus 23 to the thermal treatment apparatus 40 in the second block G2 and subjected to a temperature regulation treatment. The wafer W is then carried to the lower anti-reflection film forming apparatus 31 in the first block G1, in which a lower anti-reflection film is formed on the wafer W. The wafer W is then carried to the thermal treatment apparatus 40 in the second block G2 and heat-treated and temperature-regulated.

The wafer W is then transferred to the adhesion apparatus 41 and subjected to an adhesion treatment. The wafer W is then transferred to the resist coating apparatus 32 in the first block G1, in which a resist film is formed on the wafer W.

After the resist film is formed on the wafer W, the wafer W is then transferred to the upper anti-reflection film forming apparatus 33 in the first block G1, in which an upper anti-reflection film is formed on the wafer W. The wafer W is then transferred to the thermal treatment apparatus 40 in the second block G2, and subjected to a heat treatment. The wafer W is then transferred by the wafer carrier apparatuses 70 to the edge exposure apparatus 42 and subjected to edge exposure processing.

After the edge exposure, the wafer W is carried from the edge exposure apparatus 42 to the delivery apparatus 62 in the fourth block G4. The wafer W is then transferred by the wafer transfer apparatus 110 in the interface station 13 to the exposure station 12.

The wafer carried into the exposure station 12 is carried by the wafer carrier apparatus 120 in the exposure station 12 to the exposure apparatus 122, in which the main exposure is performed on the resist film on the wafer W. Then, the wafer W is carried to the auxiliary exposure apparatus 123, in which auxiliary exposure is performed on the resist film on the wafer W.

After exposure in the exposure station 12, the wafer W is carried by the wafer carrier apparatus 110 from the exposure station 12 to the delivery apparatus 60 in the fourth block G4. The wafer W is then carried by the wafer carrier apparatus 70 to the thermal treatment apparatus 40 and subjected to a post-exposure bake treatment. The wafer W is thereafter transferred by the wafer transfer apparatus 70 to the developing treatment apparatus 30 and developed. After the development ends, the wafer W is transferred by the wafer transfer apparatus 70 to the thermal treatment apparatus 40 and subjected to a post-bake treatment.

The wafer W is thereafter transferred to the cassette C in the cassette station 10. Thus, a series of photolithography process ends.

Note that though the auxiliary exposure by the auxiliary exposure apparatus 123 is performed after the main exposure by the exposure apparatus 122 in the above example, the auxiliary exposure may be performed before the main exposure. Further, in the case where a pre-exposure bake treatment is performed, the auxiliary exposure may be performed after the pre-exposure bake treatment or the auxiliary exposure may be performed before the pre-exposure bake treatment.

Figure 4:
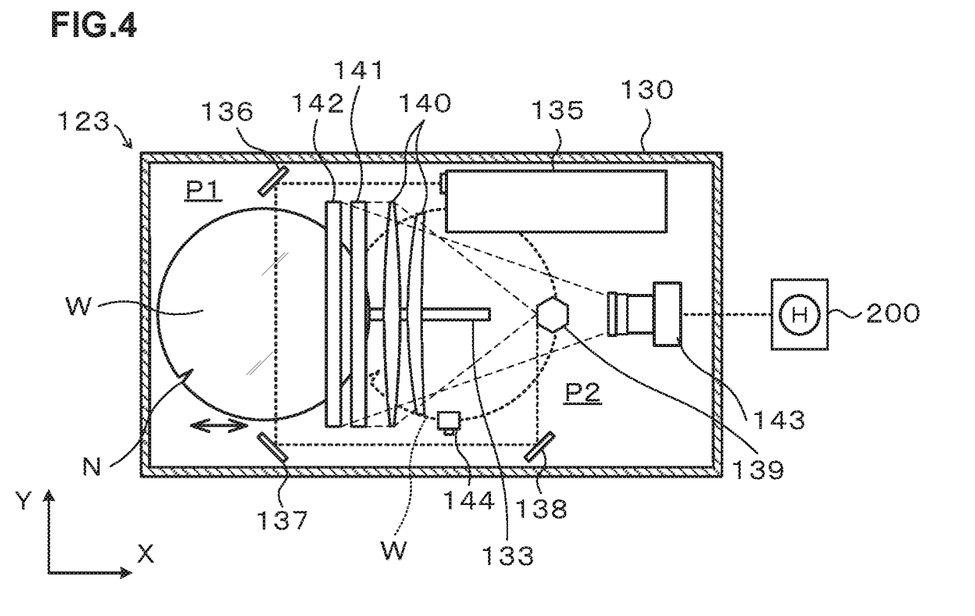
FIG. 4 is a transverse sectional view illustrating the outlined of a configuration of an auxiliary exposure apparatus in FIG. 1.
Figure 5:
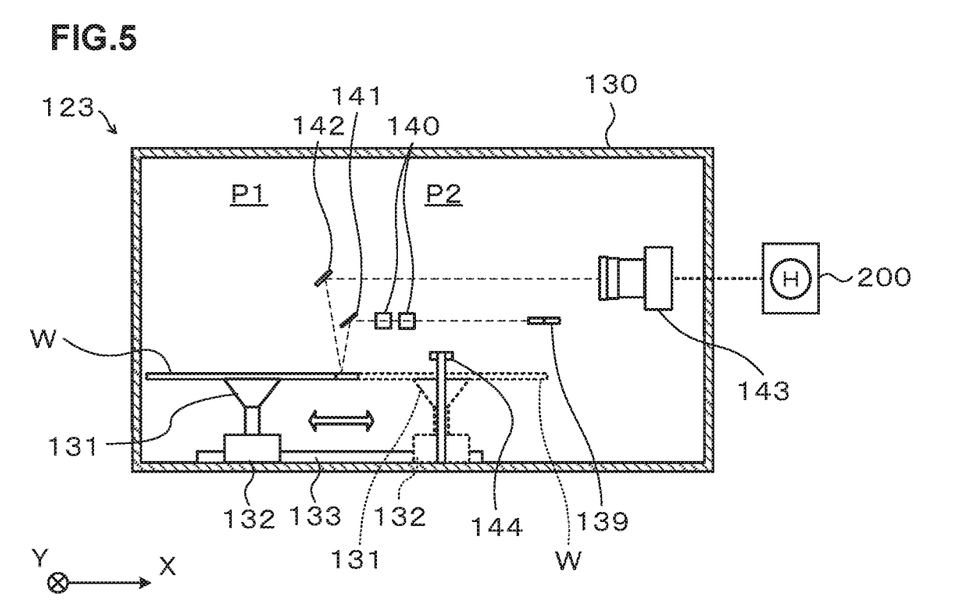
FIG. 5 is a longitudinal sectional view illustrating the outlined of the configuration of the auxiliary exposure apparatus in FIG. 1.

Subsequently, the auxiliary exposure apparatus 123 will be described. FIG. 4 and FIG. 5 are a transverse sectional view and a longitudinal sectional view illustrating the outlined of a configuration of the auxiliary exposure apparatus 123. In FIG. 5, illustration of later-described laser light source 135 and mirrors 136 to 138 is omitted.

The auxiliary exposure apparatus 123 has a housing 130 as illustrated in FIG. 4 and FIG. 5. A side surface of the housing 130 is formed with a not-illustrated carry-in/out port for carrying-in/out the wafer W. In the housing 130, a wafer chuck 131 is provided which sucks and holds the wafer W thereon. The wafer chuck 131 has a horizontal upper surface, and the upper surface is provided with a suction port (not illustrated) which sucks the wafer W. By the suction through the suction port, the wafer W can be sucked and held on the wafer chuck 131.

To the wafer chuck 131, a chuck drive unit 132 as a "moving mechanism" according to the present invention is attached as illustrated in FIG. 5. On the bottom surface of the housing 130, a guide rail 133 extending from one end side (X-direction negative direction side in FIG. 5) to the other end side (X-direction positive direction side in FIG. 5) in the housing 130 is provided. The chuck drive unit 132 is provided on the guide rail 133.

The chuck drive unit 132 has, for example, a built-in motor (not illustrated) and is configured to rotate the wafer chuck 131 and freely move along the guide rail 133. The chuck drive unit 132 configured to freely move as described above can move the wafer between a delivery position P1 where the wafer W is delivered from/to the outside of the edge exposure apparatuses 42 and an auxiliary exposure position P2 where the auxiliary exposure processing is performed on the wafer W, and can move the wafer W in a predetermined direction (X-direction) during the auxiliary exposure processing.

In the housing 130, a scan exposure unit 134 is provided which applies ultraviolet light of a predetermined wavelength to the resist on the wafer W carried in the X-direction (main scan direction) by the chuck drive unit 132 and the like. The scan exposure unit 134 applies an ultraviolet light beam to exposure areas provided at predetermined pitches on the wafer W. It is assumed that the unit of the light beam to be applied to one exposure area is a "shot", the scan exposure unit 134 is for intermittently applying one shot of light beam, and scans the light beam in a direction (Y-direction) perpendicular to the main scan direction on the resist on the wafer W by shifting the application position for every one shot. Note that when the diameter of the wafer W is 300 mm, the above exposure area is provided, for example, at a pitch of 0.5 mm, and the diameter of the light beam is 1.4 mm.

The scan exposure unit 134 has a laser light source 135, mirrors 136 to 138, a polygon mirror 139, an fθ lens 140, and a first total reflection mirror 141, and those components of the scan exposure unit 134 are located above the wafer W held on the wafer chuck 131.

The laser light source 135 is a light source that intermittently emits light made in an almost collimated light flux, more specifically, an ultraviolet light laser beam, and emits the light toward the X-direction negative direction side. The laser light source 135 is arranged at an end portion on the Y-direction positive direction side in the housing 130 and an end portion on the X-direction positive direction side.

The mirror 136 reflects the light from the laser light source 135 toward the Y-direction negative direction side, and the mirror 137 reflects the light reflected by the mirror 136 toward the X-direction positive direction side. The mirror 138 reflects the light reflected by the mirror 137 toward the Y-direction positive direction side, namely, toward the polygon mirror 139. Note that, a beam conditioner which adjusts the state of the light from the laser light source 135 may be provided, for example, in a light path between the mirror 136 and the mirror 137.

The polygon mirror 139 is a light deflector having reflection surfaces arranged in a polygonal shape and made to be rotatable at high speed around the center of the polygon as a rotation axis, and reflects the light reflected by the mirror 138 toward the fθ lens 140 while sequentially changing the angle. For the polygon mirror 139, a not-illustrated polygon mirror driver is provided so that the polygon mirror 139 is rotated at a predetermined speed by the driver.

The fθ lens 140 is for changing the traveling direction of light transmitted through the fθ lens 140, from the traveling direction before the light is incident on the fθ lens 140, and changes the traveling direction of the light reflected by the polygon mirror 139 to a predetermined direction (Y-direction negative direction) side.

The first total reflection mirror 141 is for reflecting the light reflected by the polygon mirror 139 with the angle being sequentially changed and transmitted through the fθ lens 140, toward the surface of the wafer W held on the wafer chuck 131, and is for enabling the scan in the Y-direction of the wafer W by the light reflected by the polygon mirror 139.

Note that the first total reflection mirror 141 is one example of a "first reflection member" according to the present invention, and is provided to make the light reflected by the mirror 141 incident on the wafer W at a non-right angle to the wafer W. Further, the dimension in the Y-direction of the first total reflection mirror 141 is the same or slightly larger than the diameter of the wafer W, and the dimension in the X-direction is a size with which the light reflected by the mirror 141 and further reflected by the wafer W is not incident on the mirror 141.

Further, in the housing 130, a second total reflection mirror 142 and an imaging device 143 are provided above the scan exposure unit 134.

The second total reflection mirror 142 is an example of a "second reflection member" according to the present invention, and reflects the light reflected by the first total reflection mirror 141 and further reflected by the wafer W, toward the X-direction positive direction, namely, a direction of the imaging device 143. In the case where collection of light and reception of light in the traveling direction of the light reflected by the wafer W are difficult, it is preferable to provide a reflection plate for guiding the light reflected by the wafer W toward a light receiving part, such as the second total reflection mirror 142.

The imaging device 143 is for receiving the light after reflected by the wafer W to image an exposure state of the wafer W. The imaging device 143 according to this embodiment is for receiving the light reflected by the wafer W and reflected by the second total reflection mirror 142 to image an exposure state of the wafer W.

The imaging device 143 has not-illustrated light receiving part and lens. In the imaging device 143, the light receiving part is composed of, for example, a line sensor, and is located at a position to receive the light after reflected by the wafer W in order to receive the light without hindering the auxiliary exposure processing. In the imaging device 143 according to this embodiment, the light receiving part receives the light reflected by the second total reflection mirror 142, and the lens collects the light reflected by the second total reflection mirror 142 to the light receiving part. The light receiving part of the imaging device 143 is preferably composed of an element that has sensitivity to light of the same wavelength as that of the ultraviolet light outputted from the laser light source 135. However, the light outputted from the laser light source 135 sometimes changes in wavelength into the visible light range by being reflected by the wafer W on which the resist film is formed and, in such a case, an element that has sensitivity not to the ultraviolet light but to the visible light may be used.

Inside the housing 130 and at the auxiliary exposure position P2, a position detection sensor 144 is provided. The position detection sensor 144 has, for example, a CCD camera (not illustrated) to detect an eccentricity amount from the center of the wafer W held on the wafer chuck 131 and the position of a notch portion N of the wafer W at the auxiliary exposure position P2. In the auxiliary exposure apparatus 123, it is possible to rotate the wafer chuck 131 by the chuck drive unit 132 while detecting the position of the notch portion N by the position detection sensor 144, to adjust the position of the notch portion N of the wafer W.

The chuck drive unit 132, the laser light source 135, the polygon mirror driver, the imaging device 143 and so on of the above-described components of the auxiliary exposure apparatus 123 are connected to the control unit 200, and their operations are controlled by the control unit 200.

Figure 6:
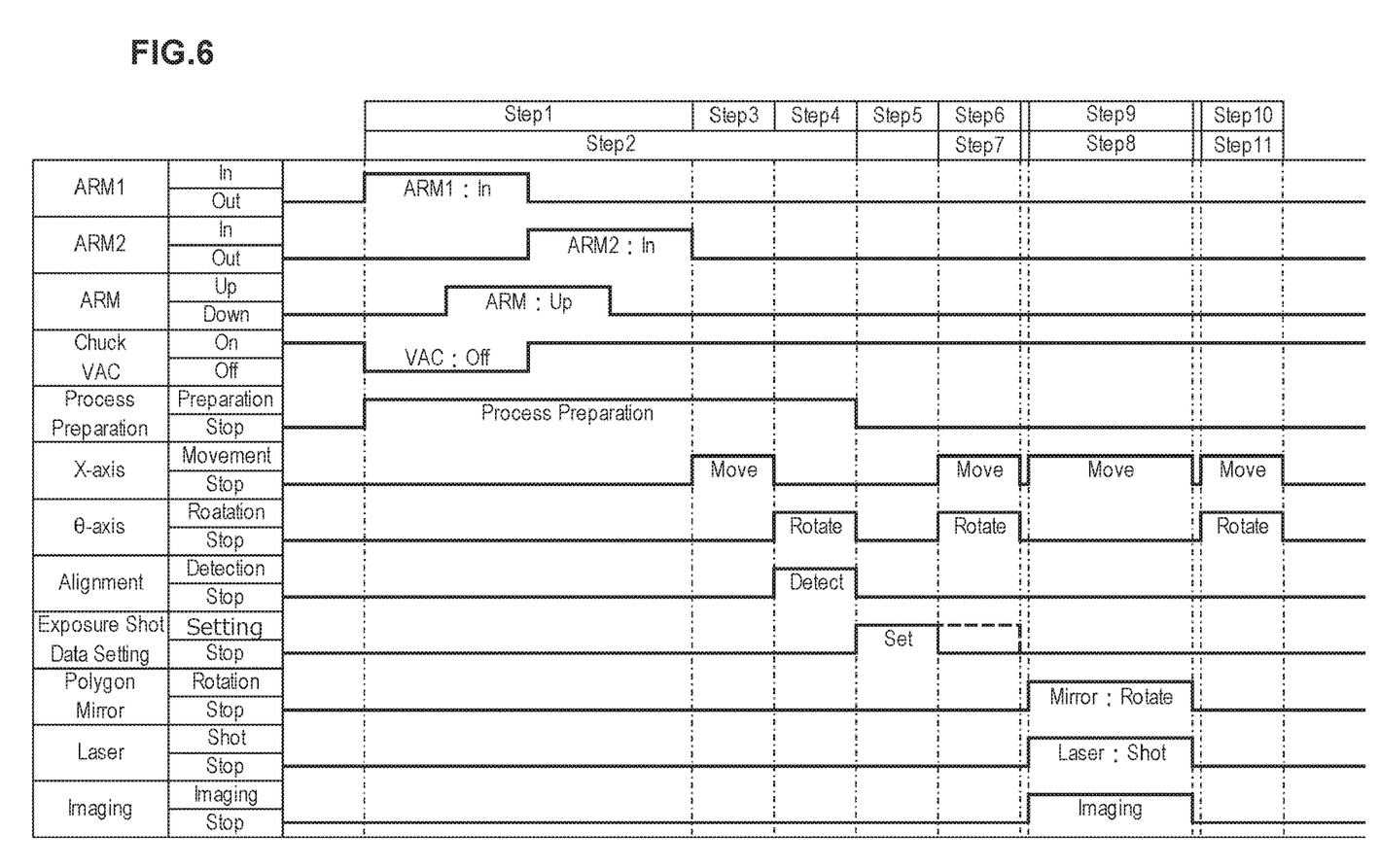
FIG. 6 is a timing chart for explaining an example of auxiliary exposure processing.
Figure 7:
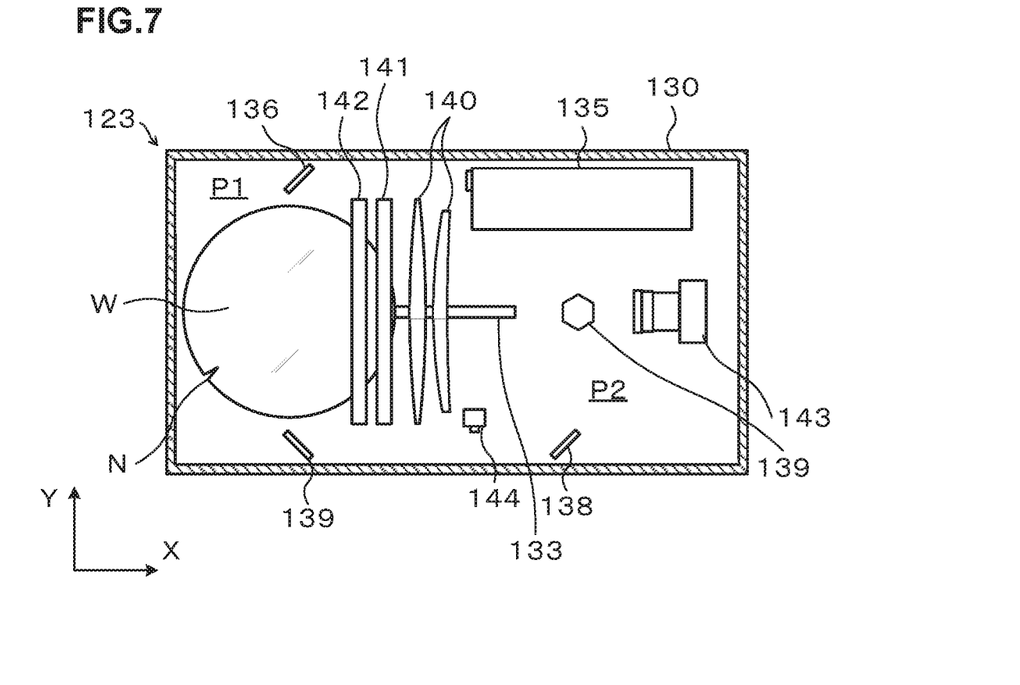
FIG. 7 is a view illustrating the appearance in the auxiliary exposure apparatus during the auxiliary exposure processing.
Figure 8:
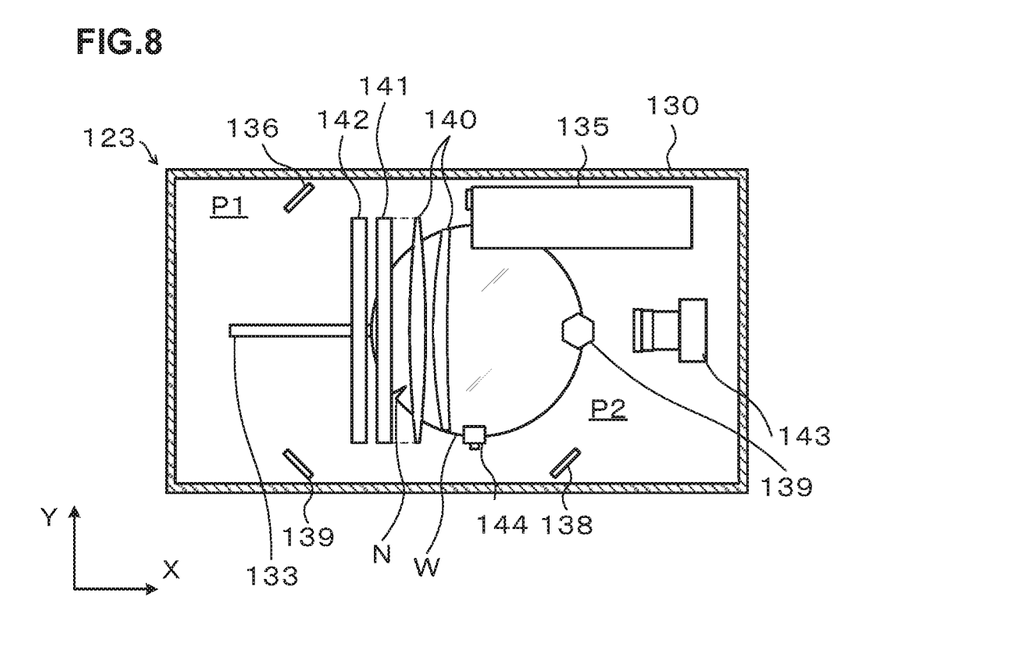
FIG. 8 is another view illustrating the appearance in the auxiliary exposure apparatus during the auxiliary exposure processing.
Figure 9:
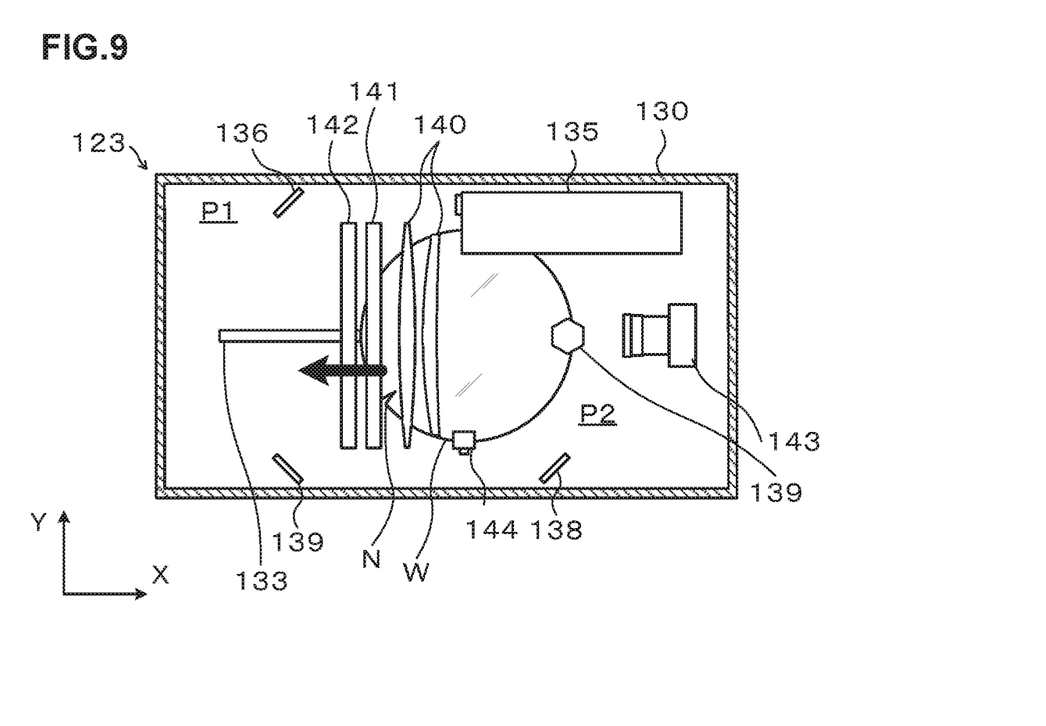
FIG. 9 is still another view illustrating the appearance in the auxiliary exposure apparatus during the auxiliary exposure processing.

Next, the auxiliary exposure processing performed using the auxiliary exposure apparatus 123 configured as described above will be described. FIG. 6 is a timing chart for explaining one example of the auxiliary exposure processing. FIG. 7 to FIG. 9 are views illustrating the appearance in the auxiliary exposure apparatus 123 during the auxiliary exposure processing. Note that an example in which a preceding wafer W remains in the auxiliary exposure apparatus 123 at the time when the auxiliary exposure is performed will be described in the following.

(Step 1: Wafer Carry-in/Out)

For performing the auxiliary exposure processing on the wafer W, first, the arm (ARM 1) of the wafer carrier apparatus 120 is inserted into the auxiliary exposure apparatus 123 and holds the preceding wafer W which is located at the delivery position P1 and sucked by the wafer chuck 131. Simultaneously with that, the suction operation by a pump (Chuck VAC) connected to the wafer chuck 131 is turned OFF. Then, the arm holding the preceding wafer W is moved up or down, and the arm is pulled out from the auxiliary exposure apparatus 123, whereby the preceding wafer W is taken out. Subsequently, another arm (ARM 2) holding the wafer W being the auxiliary exposure object is inserted into the auxiliary exposure apparatus 123, and the arm is moved up or down and mounts the wafer W being the auxiliary exposure object onto the wafer chuck 131. Then, the suction operation by the pump is turned ON, whereby the wafer W being the auxiliary exposure object is sucked and held on the wafer chuck 131. Thus, as illustrated in FIG. 7, delivery of the wafer W at the delivery position P1 is completed. After the completion of the delivery of the wafer W, the arm is pulled out from the auxiliary exposure apparatus 123.

(Step 2: Exposure Preparation)

In parallel with the above-described Step 1 and later-described Step 3 and Step 4, the control unit 200 loads data for auxiliary exposure, and calculates and decides, based on the loaded data, data for driving the laser light source 135, namely, data on illuminance for each exposure area on the wafer W. The data for auxiliary exposure is decided based on, for example, the past auxiliary exposure result and the like, and is stored in advance in a not-illustrated storage unit of the control unit 200. Note that the actual pitch of the exposure area of the wafer W is, for example, 0.5 mm as described above, whereas the exposure area of the wafer W in the data for auxiliary exposure may be made larger than that to have a pitch of, for example, 3.5 mm. In other words, common illuminance data may be used for the exposure areas in a predetermined range on the actual wafer W.

(Step 3: Movement of the Wafer W in an X-Axis Direction)

After the wafer W is held on the wafer chuck 131 at the delivery position P1 at Step 1, the wafer chuck 131, namely, the wafer W is moved by the chuck drive unit 132 to the auxiliary exposure position P2 as illustrated in FIG. 8.

(Step 4: Alignment)

Upon movement of the wafer W to the auxiliary exposure position P2, the wafer W is rotated by the chuck drive unit 132, and the position of the notch portion N of the wafer W is detected by the position detection sensor 144. Then, the control unit 200 calculates the eccentricity amount and the eccentric direction of the center of the wafer held on the wafer chuck 131 from the center of the wafer chuck 131, based on the detection result by the position detection sensor 144.

(Step 5: Data Correction)

The control unit 200 corrects the drive data of the laser light source 135 calculated at Step 2, based on the eccentricity amount and eccentric direction of the wafer calculated at Step 4. Note that the drive data of the laser light source 135 is data inputted into a not-illustrated laser controller that controls the laser light source 135.

(Step 6: Exposure Start Angle Adjustment)

After Step 5 or in parallel with Step 5, the wafer chuck 131 is rotated by the chuck drive unit 132 so that the position of the notch portion N of the wafer W held on the wafer chuck 131 is shifted by a predetermined angle from a direction in which the guide rail 133 extends.

(Step 7: X-Axis Direction Exposure Stat Position Adjustment)

In parallel with Step 6, the chuck drive unit 132 moves the wafer chuck 131 in the X-axis direction so that the position being a reference of the wafer W (for example, the center) is located at the predetermined position in regard to the X-axis direction.

(Step 8: Exposure Processing)

After Step 6 and the position adjustment at Step 7, auxiliary exposure is performed. More specifically, the laser light source 135 is driven based on the data corrected at Step 5 and the polygon mirror 139 is rotated, to thereby scan the wafer W in the Y-direction with the light emitted from the laser light source 135, then reflected by the polygon mirror 139, and subsequently reflected by the first total reflection mirror 141. Further, the chuck drive unit 132 moves the wafer chuck 131, namely, the wafer W in the X-direction as illustrated in FIG. 9, to thereby scan the wafer W in the X-direction with the light emitted from the laser light source 135, then reflected by the polygon mirror 139, and reflected by the first total reflection mirror 141.

(Step 9: Exposure Position Imaging)

In parallel with Step 8, the light reflected by the first total reflection mirror 141 and reflected by the wafer W is received by the imaging device 143, whereby the region on the wafer W exposed to the light reflected by the first total reflection mirror 141 is imaged by the imaging device 143 via the second total reflection mirror 142. In the imaging, the line sensor of the imaging device 143, more specifically, a pixel exposure time of the line sensor is synchronized with a pulse signal controlling a light emission timing of the laser light source 135 and with an encoder signal indicating the rotation angle of the polygon mirror 139. Further, the line sensor of the imaging device 143, more specifically, an imaging cycle of the line sensor is synchronized with an encoder signal indicating the position of the chuck drive unit 132, namely, the position in the X-direction of the wafer W.

(Step 10: Movement to Carryout Position)

Upon completion of the auxiliary exposure at Step 8, the chuck drive unit 132 moves the wafer chuck 131, namely, the wafer W to the delivery position P1.

(Step 11: Send-Out Angle Adjustment)

In parallel with Step 10, the chuck drive unit 132 rotates the wafer W by a predetermined angle. This enables the wafer W to be sent out at a designated angle from the auxiliary exposure apparatus 123.

The auxiliary exposure apparatus 123 performs the auxiliary exposure processing as described above and therefore can improve the in-plane uniformity of the line width of the resist pattern.

Further, in the auxiliary exposure apparatus 123, the light receiving part of the imaging device 143 receives the light applied to the wafer W and reflected from the wafer W. Accordingly, the illuminance of the actual light applied to an irradiation region can be detected for each irradiation region.

Further, since the light receiving part of the imaging device 143 receives the light applied to the wafer W and reflected from the wafer W, the distribution of the exposure amount to the resist film on the wafer W can be acquired based on the result of light reception. More specifically, since the exposure position of the wafer W is imaged by the line sensor of the imaging device 143, the results of imaging by the line sensor can be combined by the control unit 200 to acquire the distribution of the exposure amount to the resist film on the wafer W. Note that the acquisition of the distribution of the exposure amount, namely, the combination of the imaging results may not be performed by the control unit 200 but may be performed by a control unit in the imaging device 143, in other words, either the control unit 200 or the imaging device 143 can constitute an "acquisition unit" according to the present invention.

Further, according to the auxiliary exposure apparatus 123, since the distribution of the exposure amount to the resist film on the wafer W is acquired, the drive data of the laser light source 135 is calculated based on the information on the distribution of the exposure amount, for example, at the above-described Step 2 to enable further reliable improvement in in-plane uniformity of the line width of the resist pattern.

Note that it is also adoptable that after completion of the series of auxiliary exposure processing, the data for auxiliary exposure loaded at Step 2 is corrected based on the information on the distribution of the exposure amount and the corrected data for auxiliary exposure is stored so that at the time of next auxiliary exposure processing, the corrected data for auxiliary exposure is read and the drive data of the laser light source 135 is calculated based on the read data at Step 2. Also in this case, the in-plane uniformity of the line width of the resist pattern can be further reliably made into a desired one.

Besides, according to the auxiliary exposure apparatus 123, since the light receiving part of the imaging device 143 receives the light applied to the wafer W and reflected from the wafer W it is possible to determine whether or not the exposure amount at the time of auxiliary exposure is insufficient. When the exposure amount is insufficient as a result of the determination, the auxiliary exposure may be performed again by the auxiliary exposure apparatus 123. The exposure amount at the time of the auxiliary exposure performed again is decided in consideration of the exposure amount in the preceding auxiliary exposure.

The scan of light in the Y-direction to the wafer W is performed by rotating the polygon mirror 139 in the above example, but may be performed by changing the angle of a mirror portion of a galvanometer mirror. Besides, the scan of light in the X-direction to the wafer W is performed by moving the wafer in X-direction, but may be performed by changing the angle of the mirror portion of the galvanometer mirror.

Note that the auxiliary exposure apparatus according to this embodiment is applicable also to the case of using a photosensitized chemically amplified resist material as the resist material. The case of using the photosensitized chemically amplified resist material includes a pattern exposure process of applying an ionizing radiation or a nonionizing radiation having a wavelength of 400 nm or less to a predetermined position of the resist film, and another exposure process of applying a nonionizing radiation having a wavelength longer than the wavelength of the nonionizing radiation in the pattern exposure process to the resist material film after the pattern exposure process. The exposure processing by the auxiliary exposure apparatus according to this embodiment may be applied to the another exposure process.

Second Embodiment

Figure 10:
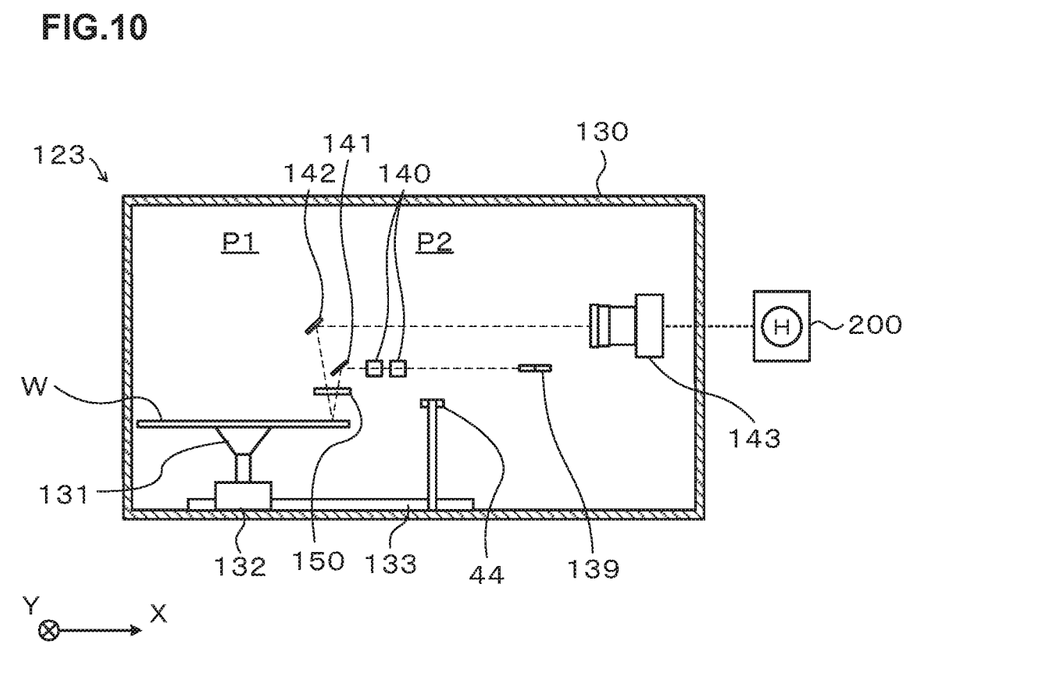
FIG. 10 is a view for explaining the outline of a configuration of an auxiliary exposure apparatus according to a second embodiment of the present invention.

FIG. 10 is a view for explaining the outline of a configuration of an auxiliary exposure apparatus according to a second embodiment of the present invention.

The auxiliary exposure apparatus 123 in FIG. 10 has a multi-reflection preventing plate 150. The multi-reflection preventing plate 150 is a multi-reflection preventing plate that prevents the light applied to and irregularly reflected by the wafer W from being reflected again by the first total reflection mirror 141 and/or the second total reflection mirror 142 and returning to the wafer W.

Figure 11:
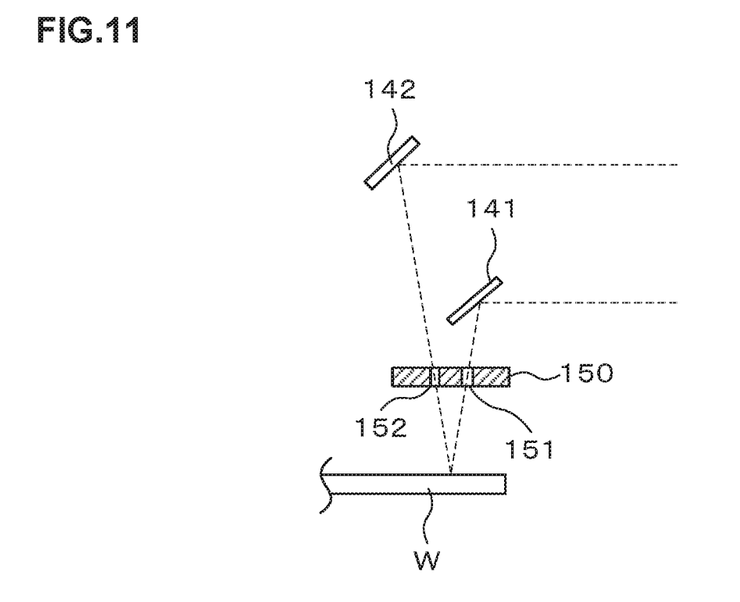
FIG. 11 is a view for explaining an example of a multi-reflection preventing plate provided in the auxiliary exposure apparatus in FIG. 10.

FIG. 11 is a view for explaining the multi-reflection preventing plate 150 with only the multi-reflection preventing plate 150 illustrated in a cross section.

The multi-reflection preventing plate 150 has, as illustrated in FIG. 11, for example, a first slit 151 through which the light reflected by the polygon mirror 139 (see FIG. 5), reflected by the first total reflection mirror 141, and directed toward the wafer W passes, and a second slit 152 through which the light reflected by the first total reflection mirror 141 and mirror-reflected by the wafer W passes.

Note that the multi-reflection preventing plate 150 is formed of a material absorbing light or the like.

Provision of the multi-reflection preventing plate 150 enables further reliable improvement in the in-plane uniformity of the line width of the resist pattern.

Figure 12:
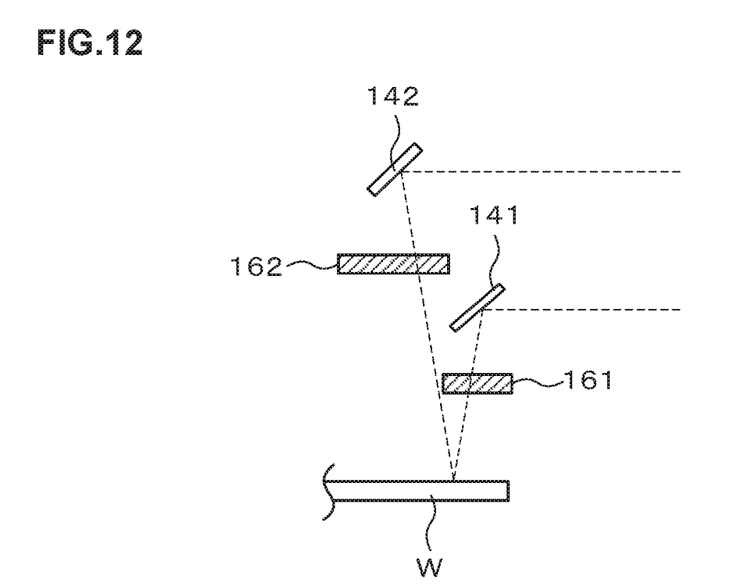
FIG. 12 is a view for explaining another example of the multi-reflection preventing plate.

FIG. 12 is a view for explaining another example of the multi-reflection preventing plate.

In the example of FIG. 12, the multi-reflection preventing plate is composed of two first and second multi-reflection preventing plates 161, 162, and each of the first and second multi-reflection preventing plates 161, 162 is composed of a member transmitting only light from a predetermined direction.

The first multi-reflection preventing plate 161 transmits the light reflected by the polygon mirror 139 (see FIG. 5), reflected by the first total reflection mirror 141, and directed toward the wafer W. The first multi-reflection preventing plate 161 is arranged not to block the light transmitted through the plate 161, mirror-reflected by the wafer W, and directed towards the second total reflection mirror 142 but to block the light irregularly reflected by the wafer W and directed toward the first total reflection mirror 141.

The second multi-reflection preventing plate 162 transmits light reflected by the wafer W and directed toward the second total reflection mirror 142. The second multi-reflection preventing plate 162 is arranged to block the light transmitted through the plate 162, reflected by the second total reflection mirror 142, for example, an end portion of the mirror 142, and directed toward the wafer W.

Provision of the first and second multi-reflection preventing plates 161, 162 enables further reliable improvement in the in-plane uniformity of the line width of the resist pattern.

Preferred embodiments of the present invention have been described above with reference to the accompanying drawings, but the present invention is not limited to the embodiments. It should be understood that various changes and modifications are readily apparent to those skilled in the art within the scope of the spirit as set forth in claims, and those should also be covered b the technical scope of the present invention.

The present invention is useful for a technique of exposing a resist film on a substrate.

What is claimed is:

1. An auxiliary exposure apparatus, separately from an apparatus performing exposure processing of transferring a pattern of a mask to a resist film applied on a substrate, the auxiliary exposure apparatus comprising:
    a light source configured to apply auxiliary light of a predetermined wavelength to a resist film on the substrate;
    a first reflection member configured to reflect the auxiliary light from the light source toward the substrate;
    a light receiving part configured to receive the auxiliary light after reflected by the substrate;
    an acquisition unit configured to acquire, for the auxiliary light, a distribution of an exposure amount to the resist film on the substrate, based on a reception result by the light receiving part while scanning the substrate with the auxiliary light; and
    a controller configured to control the auxiliary light of the light source in accordance with driving data representing, for each exposure area on the substrate, illuminance for the each exposure area,
    wherein the controller is configured to decide the driving data in accordance with the distribution of the exposure amount acquired by the acquisition unit.

2. The auxiliary exposure apparatus according to claim 1, further comprising:
    a second reflection member configured to reflect the auxiliary light reflected by the first reflection member and reflected by the substrate,
    wherein the light receiving part receives the auxiliary light reflected by the second reflection member.

3. The auxiliary exposure apparatus according to claim 1, further comprising:
    a moving mechanism configured to move the substrate in a predetermined direction; and
    a polygon mirror configured to reflect the auxiliary light from the light source toward the first reflection member,
    wherein the moving mechanism moves the substrate to scan the substrate in the predetermined direction with the auxiliary light reflected by the polygon mirror and reflected by the first reflection member, and
    wherein the polygon mirror is rotated to scan the substrate in a direction perpendicular to the predetermined direction with the auxiliary light reflected by the polygon mirror and reflected by the first reflection member.

4. The auxiliary exposure apparatus according to claim 1, wherein the first reflection member is provided so that the auxiliary light reflected by the first reflection member is incident on the substrate at a non-right angle to the substrate.

5. The auxiliary exposure apparatus according to claim 1, wherein the light receiving part is a line sensor.

6. The auxiliary exposure apparatus according to claim 5, wherein the light receiving part has sensitivity to an ultraviolet ray.

7. The auxiliary exposure apparatus according to claim 1, wherein the light receiving part has sensitivity to an ultraviolet ray.

8. The auxiliary exposure apparatus according to claim 1, further comprising
    the light source that applies the auxiliary light to the resist film on the substrate, wherein
    the auxiliary light from the light source is driven based on the acquired distribution of the exposure amount to the resist film.

9. An exposure amount distribution acquisition method of acquiring a distribution of an exposure amount to a resist film on a substrate, in auxiliary exposure processing performed by an auxiliary exposure apparatus separately from an apparatus performing exposure processing of transferring a pattern of a mask to the resist film applied on the substrate, the exposure amount distribution acquisition method comprising:
    in the auxiliary exposure processing, reflecting auxiliary light from a light source configured to emit auxiliary light of a predetermined wavelength, toward the substrate by a first reflection member;
    receiving the auxiliary light after reflected by the substrate by a light receiving part;
    acquiring, for the auxiliary light, the distribution of the exposure amount to the resist film on the substrate, based on a result of reception of the light by the light receiving part while scanning the substrate with the auxiliary light; and controlling the auxiliary light of the light source in accordance with driving data representing, for each exposure area on the substrate, illuminance for the each exposure area;

further comprising deciding the driving data in accordance with the distribution of the exposure amount which is acquired.

10. The exposure amount distribution acquisition method according to claim 9, wherein when the auxiliary light after reflected by the substrate is received by the light receiving part, the auxiliary light reflected by the first reflection member and reflected by the substrate is reflected by a second reflection member and received by the light receiving part.

11. The exposure amount distribution acquisition method according to claim 9, further comprising:

in the auxiliary exposure processing, moving the substrate by a moving mechanism configured to move the substrate in a predetermined direction, and rotating a polygon mirror configured to reflect the auxiliary light from the light source toward the first reflection member; and receiving the auxiliary light reflected by the polygon mirror and reflected by the first reflection member, by the light receiving part.

12. The exposure amount distribution acquisition method according to claim 9, wherein the auxiliary light reflected by the first reflection member is reflected by the first reflection member so as to be incident on the substrate at a non-right angle to the substrate.

13. The exposure amount distribution acquisition method according to claim 9, further comprising in the auxiliary exposure processing, applying the auxiliary light from the light source to the resist film on the substrate, and driving the auxiliary light from the light source based on the acquired distribution of the exposure amount to the resist film.

* * * * *